United States Patent
Ben-Dov et al.

(10) Patent No.: US 6,745,095 B1
(45) Date of Patent: Jun. 1, 2004

(54) DETECTION OF PROCESS ENDPOINT THROUGH MONITORING FLUCTUATION OF OUTPUT DATA

(75) Inventors: Yuval Ben-Dov, Sunnyvale, CA (US); Moshe Sarfaty, Cupertino, CA (US); Alexander Viktorovich Garachtchenko, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 359 days.

(21) Appl. No.: 09/686,656

(22) Filed: Oct. 4, 2000

(51) Int. Cl.$^7$ ............................... G06F 19/00
(52) U.S. Cl. .................. 700/121; 700/30; 700/220; 438/710
(58) Field of Search .................. 700/30, 31, 220, 700/33, 121; 438/710; 703/2

(56) References Cited

U.S. PATENT DOCUMENTS

| | | | |
|---|---|---|---|
| 4,312,732 A | 1/1982 | Degenkolb et al. ......... 204/192 |
| 4,948,259 A | 8/1990 | Enke et al. | |
| 5,374,327 A | 12/1994 | Imahashi et al. | |
| 5,552,016 A | 9/1996 | Ghanayem ............... 156/627.1 |
| 5,846,373 A | 12/1998 | Pirkle et al. ................ 156/345 |
| 6,046,796 A | 4/2000 | Markle et al. | |
| 6,153,115 A | * 11/2000 | Le et al. ........................ 216/60 |
| 6,246,972 B1 | * 6/2001 | Klimasauskas ................ 703/2 |

FOREIGN PATENT DOCUMENTS

| | | |
|---|---|---|
| JP | 10081965 | 3/1998 |
| WO | WO 99/21210 A1 | 4/1999 |
| WO | WO 99/40617 A1 | 8/1999 |

OTHER PUBLICATIONS

Department of Chemical Engineering, University of Texas, Model–Based control in Microelectronics Manufacturing, IEEE 1999, p. 4185–4191.*
Sovarong Leang, A control System for Photolithographic Sequqnces, IEEE 1996, p. 191–207.*
Moshe Sarfaty et al., "*Temporal fluctuations: A fingerprint of surface chemical reactions*", Applied Physics Letters, vol. 76, No. 24, Jun. 12, 2000, pp. 3641–3643.

* cited by examiner

*Primary Examiner*—Leo Picard
*Assistant Examiner*—Kidest Bahta
(74) *Attorney, Agent, or Firm*—Townsend and Townsend and Crew

(57) ABSTRACT

Progress of a semiconductor fabrication process is monitored by detecting data output by the process, and then correlating a specific process event to fluctuations in the output data over a time period of 10 milliseconds or less. In one embodiment, endpoint of a plasma chamber cleaning process may be identified by calculating standard deviation of intensity of optical chamber emissions based upon a local time period. The time at which standard deviation of optical emissions attains a steady state indicates endpoint of the cleaning process. Another approach to characterizing fluctuation is to perform a Fast Fourier Transform (FFT) on the output emissions data, and then to plot over time the total power of the emissions over a relevant frequency range. The time at which total power attains a steady state also reveals endpoint of the process. Other techniques for characterizing fluctuation for process monitoring include calculation of the root-mean-square or entropy of an output signal.

35 Claims, 11 Drawing Sheets

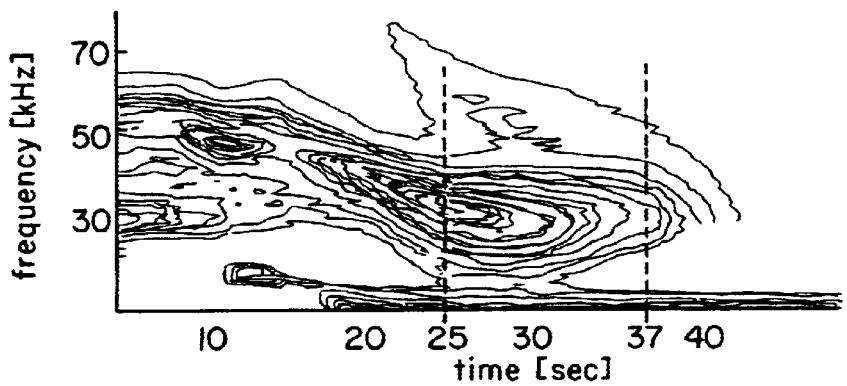
FIG. 6A.
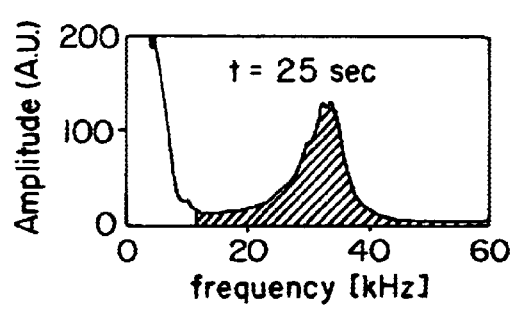 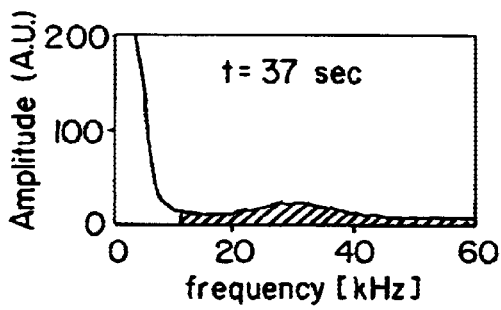
FIG. 6B.    FIG. 6C.
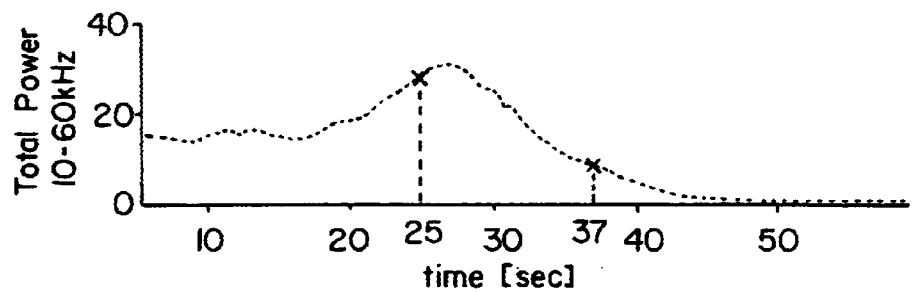
FIG. 6D.

DETECTION OF PROCESS ENDPOINT THROUGH MONITORING FLUCTUATION OF OUTPUT DATA

CROSS-REFERENCE TO RELATED APPLICATIONS

This application contains subject matter related to the following copending application which is hereby incorporated by reference: U.S. patent application Ser. No. 09/288,041, filed Apr. 7, 1999.

BACKGROUND OF THE INVENTION

Within the semiconductor industry, an ever present need exists for improved process repeatability and control, and in particular for ways of monitoring progress of a process. For example, during the formation of a typical metal-layer-to-metal-layer interconnect, a dielectric layer is deposited over a first metal layer, a via hole is etched in the dielectric layer to expose the first metal layer, the via hole is filled with a metal plug and a second metal layer is deposited over the metal plug (e.g., forming an interconnect between the first and the second metal layers). To ensure the interconnect has low contact resistance, all dielectric material within the via hole must be etched from the top surface of the first metal layer prior to formation of the metal plug thereon; otherwise, residual high-resistivity dielectric material within the via hole significantly degrades the contact resistance of the interconnect. Similar process control is required during the etching of metal layers (e.g., Al, Cu, Pt, etc.), polysilicon layers and the like.

Conventional process monitoring techniques provide only a rough estimate of when a material layer has been completely etched (i.e., endpoint). Accordingly, to accommodate varying thicknesses of material layers (e.g., device variations) or varying etch rates of material layers (e.g., process/process chamber variations), an etch process may be continued for a time greater than a predicted time for etching the material layer (i.e., for an over-etch time). Etching for an over-etch time ensures that all material to be removed is removed despite device variations that increase the required etch time and despite process/process chamber variations which slow etch rate (and thus increase the required etch time).

While over-etch times ensure complete etching, over-etching raises a number of issues. Overetching increases the time required to process each semiconductor wafer, and thus decreases wafer throughput. Moreover, the drive for higher performance integrated circuits requires each generation of semiconductor devices to have finer dimensional tolerances, making over-etching increasingly undesirable. Overetching also prolongs exposure of the wafer to a plasma environment, affecting the heat budget of the process, generating additional particles that could contaminate the wafer, and consuming expensive process materials.

A more attractive solution is an in situ monitoring technique that more accurately identifies significant processing events such as etch endpoint, chamber clean endpoint, and chamber seasoning. However, conventional monitoring techniques do not track progress of a semiconductor fabrication process accurately enough to reduce over-etch or other over-processing times required to compensate for both process/process chamber variations and device variations (e.g., material layer thickness variations, etch property variations, etc.). Moreover, previous attempts to correlate fluctuation in output data with process events have considered changes in output data over time periods on the order of seconds.

Accordingly, a need exists for an improved method and apparatus for monitoring semiconductor processes.

SUMMARY OF THE INVENTION

The present inventors have discovered that detecting fluctuation in the output data of a semiconductor fabrication process over extremely short time periods can provide previously unavailable information concerning the progress of the fabrication process. Embodiments of the present invention allow progress of a semiconductor fabrication process to be monitored by detecting fluctuations in output from the process over an extremely short time period of 10 milliseconds or less. For example, in accordance with one embodiment of the present invention, endpoint of a plasma chamber cleaning process may be detected by measuring optical emissions from a plasma chamber at a rate of>1 kHz, and then calculating standard deviation in optical emissions based upon a local time period of one second or less. Endpoint of the chamber cleaning process is indicated when standard deviation of optical emission attains a steady-state minimum value.

Alternatively, endpoint of a plasma chamber cleaning process may be determined by performing a Fast Fourier Transformation (FFT) to resolve the emission output data into frequency and amplitude components, and then identifying the point at which total power of optical emissions taken over all relevant frequencies attains a steady state.

Yet further alternatively, where optical emissions are absent from the plasma chamber due to a lack of electrons, endpoint of a plasma chamber cleaning process may be determined by monitoring fluctuations in optical emissions of a plasma cell positioned downstream from the plasma chamber and receiving exhaust from the plasma chamber.

While the above description relates to detecting endpoint of a plasma process by monitoring fluctuation in optical data output by the process, the invention is not limited to this particular application. The progress of a process could also be monitored by detecting fluctuation of other types of output signals, including but not limited to RF power fluctuations, temperature fluctuations, pressure fluctuations, and fluctuations in readings of a mass-spectrometer receiving by-products of the process.

One embodiment of a method in accordance with the present invention comprises measuring a value of an output from the semiconductor fabrication process, characterizing a fluctuation in the value of the output over a time period of 10 milliseconds or less, and correlating the fluctuation to an event of the semiconductor fabrication process.

One embodiment of an apparatus for processing a substrate in accordance with the present invention comprises a substrate processing chamber; and a sensor operatively coupled to said substrate processing chamber to detect a value of an output from the chamber. A computer processor is operatively coupled to said sensor; and a memory is coupled to said computer processor. The memory stores a computer program in computer readable format including computer instructions to permit said processor to measure a value of an output from the process, and characterize a fluctuation in the value of the output over a time period of 10 milliseconds or less.

These and other embodiments of the present invention, as well as its advantages and features, are described in more detail in conjunction with the text below and attached figures.

BRIEF DESCRIPTION OF THE DRAWINGS

FIG. 6A plots a contour image of a frequency spectrum of plasma intensity versus elapsed time, for a chamber cleaning process.

FIGS. 6B and 6C each plot the amplitude component of the photodiode signal versus the frequency component at a narrow time interval during the process of FIG. 6A.

FIG. 6D plots total power of the photodiode signal over a frequency range versus time of the process of FIG. 6A.

DESCRIPTION OF THE SPECIFIC EMBODIMENTS

Previous attempts to monitor progress of a semiconductor process through the detection of changes in output data have examined changes on the order of seconds. However, the inventors of the present application have discovered that detecting fluctuation in the output data much shorter time periods can provide previously unavailable information concerning process events. The method of the present invention can be employed for process monitoring in connection with a wide variety of semiconductor techniques. For purposes of illustration however, the following detailed description focuses upon an embodiment relating to detecting an endpoint of a plasma chamber cleaning process.

Figure 1A:
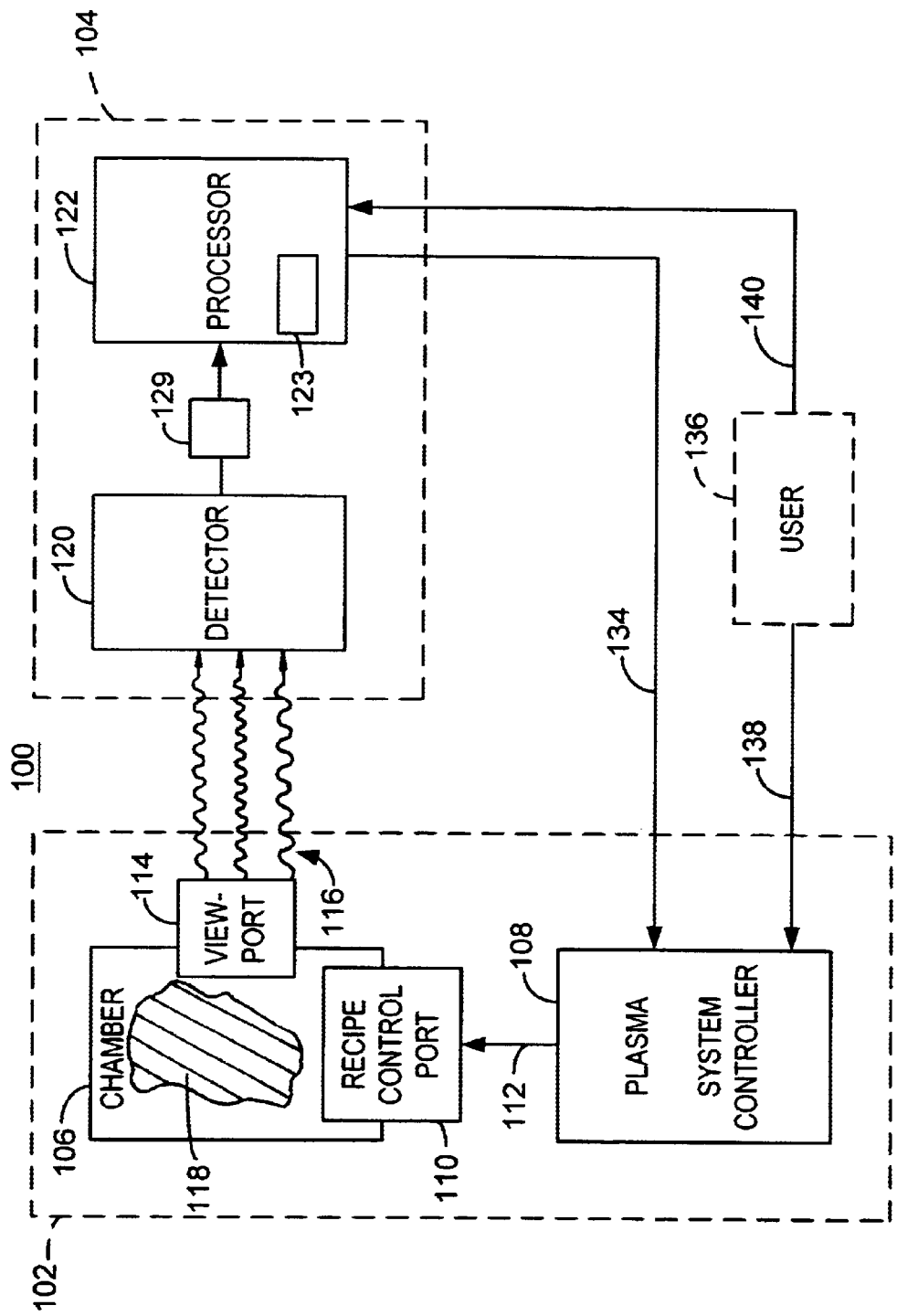
FIGS. 1A–C are schematic diagrams of a plasma processing system employing an inventive process monitoring system in accordance with embodiments of the present invention.

FIG. 1A is a schematic diagram of a processing system 100 comprising a conventional plasma system 102 (for example, a plasma etching system or plasma enhanced chemical vapor deposition system) and one embodiment of an inventive process monitoring system 104 in accordance with the present invention coupled thereto. As used herein, "coupled" means coupled directly or indirectly so as to operate.

The conventional plasma system 102 comprises a plasma chamber 106 coupled to a plasma system controller 108 via a recipe control port 110 and via a first control bus 112. It will be understood that while a singular interface (e.g., the recipe control port 110) is shown between the plasma chamber 106 and the plasma system controller 108 for convenience, in general, the plasma system controller 108 may interface the various mass flow controllers, RF generators, temperature controllers, etc., associated with the plasma chamber 106 via a plurality of interfaces (not shown).

The plasma chamber 106 comprises a viewport 114 for outputting electromagnetic emissions from a plasma 118 sustained within the plasma chamber 106 (described below). While the viewport 114 is shown positioned on the side of the plasma chamber 106, it will be understood that the viewport 114 may be positioned at any other location (e.g., on the top or bottom of the chamber 106).

The inventive process monitoring system 104 comprises a detector 120 coupled to a processing mechanism (e.g., a processor 122) through a pre-amplifier 129. Processor 122 operates by executing computer instructions stored in a memory 123. The processor 122 is coupled to the plasma system controller 108 via a second control bus 134.

Figure 1B:
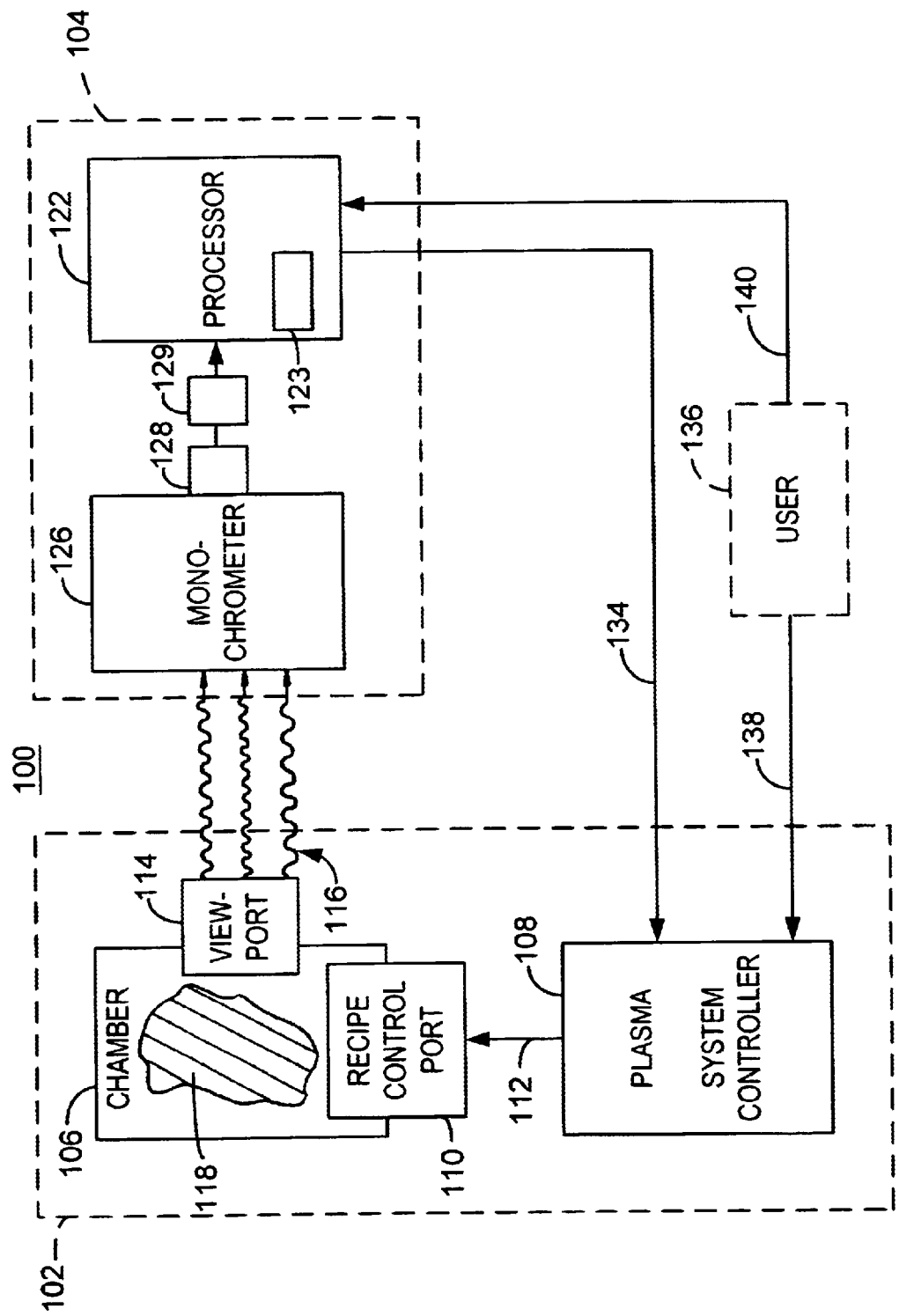

Detector 120 is positioned to collect the electromagnetic emissions 116 from the plasma 118 and may comprise a broadband photodiode such as a silicon photodiode. The detector 120 alternatively may comprise a monochrometer 126 coupled to a photomultiplier tube 128 (FIG. 1B) for detecting electromagnetic emissions from specific chemical species as described below. A lens 130 and a fiber optic cable 132 also may be disposed between the viewport 114 and the detector 120 (FIG. 1C) for improving collection of the electromagnetic emissions 116 by the detector 120 (e.g., by coupling the electromagnetic emissions 116 into the fiber optic cable 132 via the lens 130 and by transporting the electromagnetic emissions 116 to the detector 120 via the fiber optic cable 132).

Other alternative configurations for collecting electromagnetic emissions from the plasma 118 may be employed such as a monochrometer or spectrometer equipped with a photodiode array wherein each photodiode monitors a different wavelength. If desired, a bundle of fiber optic cables in connection with various optical filters may be coupled to the diode array, wherein each fiber optic cable within the bundle is coupled to a unique photodiode and supplies electromagnetic emissions thereto. Similarly, diffraction gratings, prisms, optical filters (e.g., glass filters) and other wavelength selective devices may be employed in place of the monochrometer.

In operation, a user 136 (e.g., a person in charge of a wafer fabrication process) supplies (via a third control bus 138) the plasma system controller 108 with a set of instructions for generating the plasma 118 within the plasma chamber 106 (i.e., a plasma recipe). Alternatively, a remote computer system for running a fabrication process that includes the processing system 100, a manufacturing execution system or other fabrication control systems may supply the plasma system controller 108 with a plasma recipe (e.g., as supplied by the user 136 or as stored within a plasma recipe database).

A typical plasma recipe includes processing parameters such as the pressure, temperature, power, gas types, gas flow rates and the like used to initiate and maintain the plasma 118 within the plasma chamber 106 during plasma processing. For example, to perform aluminum etching within the plasma chamber 106, a typical plasma recipe would include at least the following: a desired chamber pressure, a desired process temperature, a desired RF power level, a desired wafer bias, desired process gas flow rates (e.g., desired flow rates for process gasses such as Ar, $BCl_3$ or $Cl_2$), etc.

Once the plasma system controller 108 receives a plasma recipe from the user 136, from a remote computer system, or from a manufacturing execution system, etc., the plasma recipe is supplied to the recipe control port 110 via the first control bus 112, and the recipe control port 110 (or the plasma system controller 108 itself) establishes and maintains within the plasma chamber 106 the processing parameters specified by the plasma recipe.

During a plasma process within the plasma chamber 106, the plasma 118 generates electromagnetic emissions having wavelengths primarily in the optical spectrum (e.g., from about 200 to 1100 nanometers), although both ultra-violet and infrared wavelengths also may result. A portion of these electromagnetic emissions (e.g., the electromagnetic emissions 116) travel through the viewport 114 and reach the inventive process monitoring system 104. Note that while the electromagnetic emissions 116 are represented generally by three emission wavelengths in FIGS. 1A–1C, it will be understood that the electromagnetic emissions 116 typically comprise many more wavelengths.

Figure 1C:
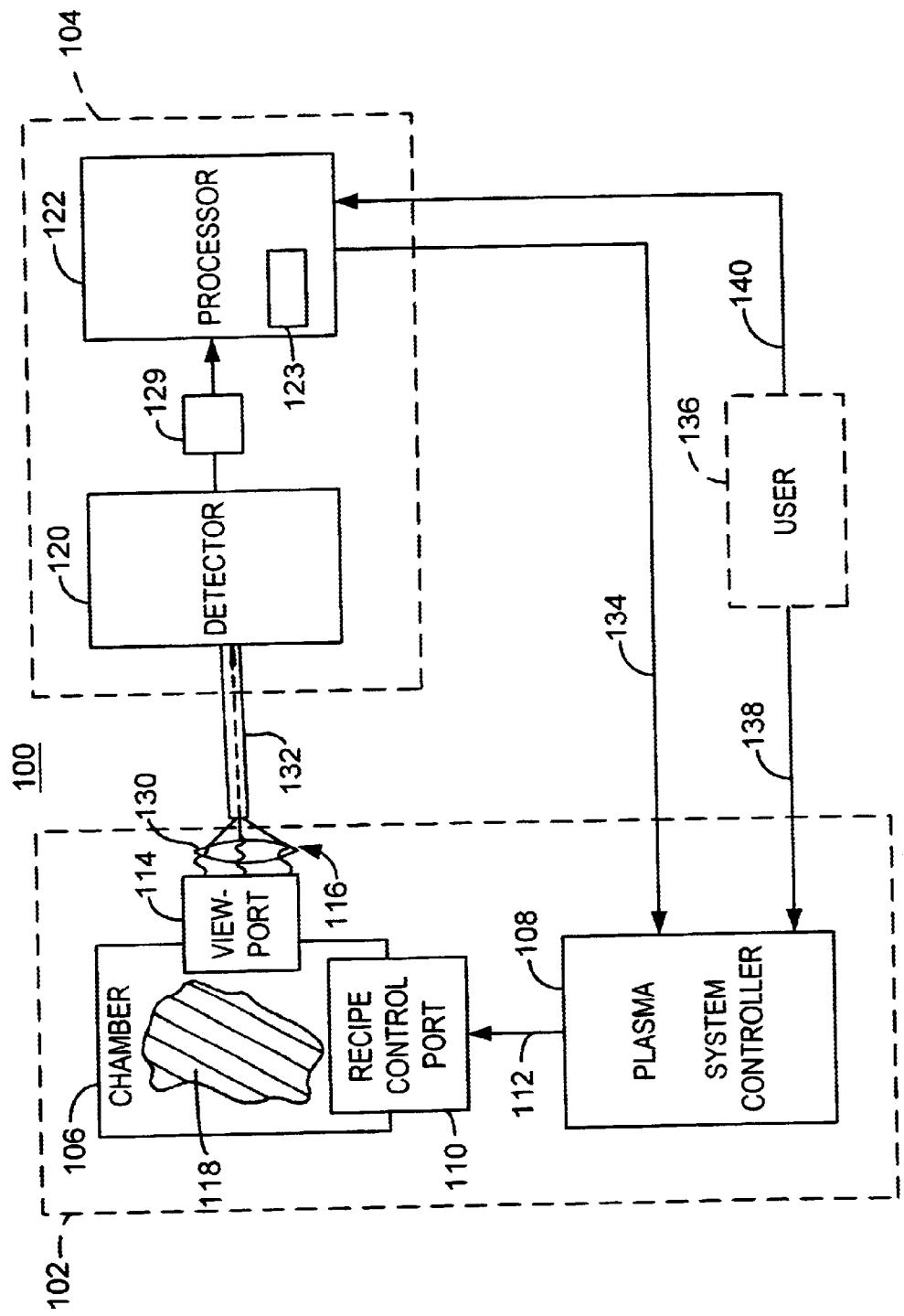

With reference to FIGS. 1A and 1C, the detector 120 receives the electromagnetic emissions 116 either directly (FIG. 1A) or indirectly via the lens 130 and the fiber optic cable 132 (FIG. 1C). Assuming the detector 120 is a silicon photodiode, the detector 120 detects the intensity of electromagnetic emissions within the broad wavelength range from about 200 to 1100 nanometers (hereinafter the "optical emission spectrum (OES)"), and in response thereto, generates a detection signal to pre-amplifier 129. This detection signal (e.g., an optical emission current signal or an "OE signal") is proportional to the intensity of the detected electromagnetic emissions.

The detector 120 then outputs the OE signal. The OE signal is amplified via pre-amplifier 129, and the amplified OE signal is supplied to the processor 122 for subsequent processing (described below).

The particular type of processing to be performed by the processor 122 preferably is selected by the user 136 (or by a remote computer system, by a manufacturing execution system, etc.) via a fourth control bus 140. Thus, in accordance with the present invention, an attribute (e.g., electromagnetic emissions) of plasma 118 is measured via detector 120, and a detection signal (e.g., an OE signal) is generated by the detector 120.

Figure 2A:
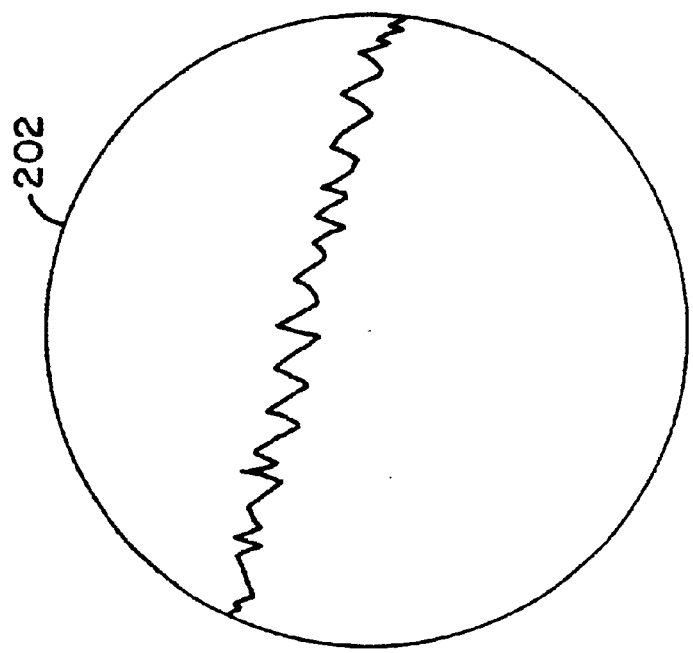
FIG. 2A is an enlargement of a portion of the optical emission intensity signal shown in FIG. 2.

As described in detail below, processor 122 monitors changes in intensity of the detection signal over time. However, rather than conventionally examining the overall magnitude of changes of the OE signal 200 over an extended time period, (e.g., the change in intensity from $I_1$ to $I_2$ occurs over a time period on the order of seconds), processor 122 characterizes fluctuation in the OE signal (e.g., portion 202 of the OE signal 200 shown enlarged in FIG. 2A) over a much shorter time period.

Although not illustrated in this particular embodiment of the present invention, fluctuation in output signals other than optical emissions could be utilized to monitor progress of a semiconductor fabrication process. Possible alternative output signals include temperature, pressure, RF power, and mass spectrometry readings from the process chamber.

Figure 1D:
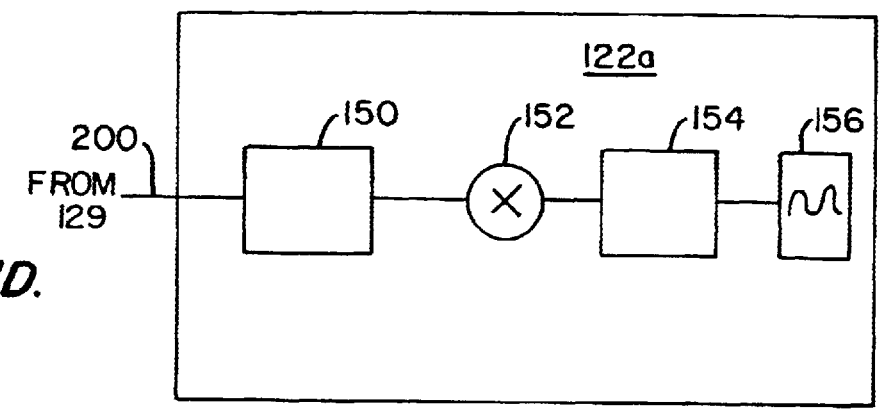
FIG. 1D is a block diagram of an embodiment of an analog processor for use in a method of monitoring a process in accordance with the present invention.

FIG. 1D is a block diagram of one embodiment of an analog processor for use in monitoring a process in accordance with the present invention. Analog processor 122a receives amplified analog OE signal 200 from amplifier 129 and passes this amplified signal through filter 150. In the particular embodiment shown in FIG. 1D, filter 150 is a band pass or high pass filter. Depending upon the particular application however, filter 150 could also be a high or low pass filter.

Figure 1E:
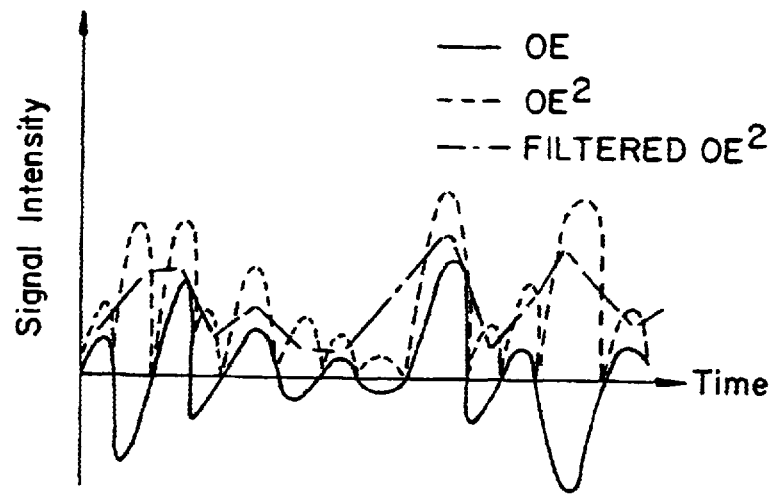
FIG. 1E illustrates analog determination of output fluctuation in accordance with one embodiment of the present invention.

Multiplier 152 then multiplies the filtered analog signal by itself, with the resulting positive signal is passed through low pass filter 154 to reflect a mean value whose fluctuation over time can be displayed by oscilloscope 156. The resulting manipulation of the analog signal is shown in FIG. 1E, which plots signal intensity versus time for the OE signal, the $OE^2$ signal, and the filtered $OE^2$ signal, and illustrates analog determination of output fluctuation in accordance with the present invention. As an alternative to multiplier 152, operational amplifier or diode bridge structures could be utilized.

Figure 1F:
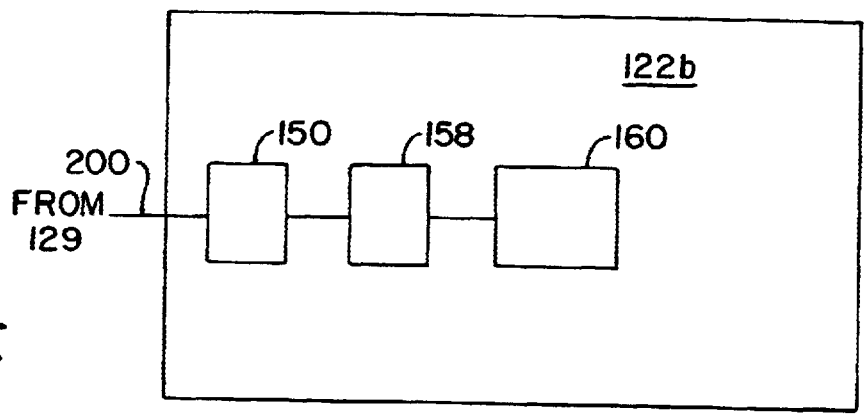
FIG. 1F is a block diagram of an embodiment of a digital processor for use in a method of monitoring a process in accordance with the present invention.

Alternatively, FIG. 1F shows a block diagram of an embodiment for a digital processor for use in monitoring a process in accordance with the present invention. Digital processor 122b receives an amplified analog OE 200 signal from amplifier 129 and passes this amplified signal to A/D converter 158. Optionally, analog OE signal 200 may be filtered by band pass or high pass filter 150 prior to reaching A/D converter 158. A/D converter 158 rapidly samples OE signal 200. For example, if OE signal 200 is sampled with a 10 kHz sampling rate, the intensity of the OE signal will be detected every 0.0001 sec. It will be understood that sampling rates other than 10 kHz may be similarly employed. However, the present inventors have found that an OE signal provides significant plasma etching endpoint information when sampling rates of greater than 1 kHz are employed. The sampled digital signal is then communicated to a logic block 160, which characterizes fluctuation of the OE signal 200 as a standard deviation or other value.

Figure 3:
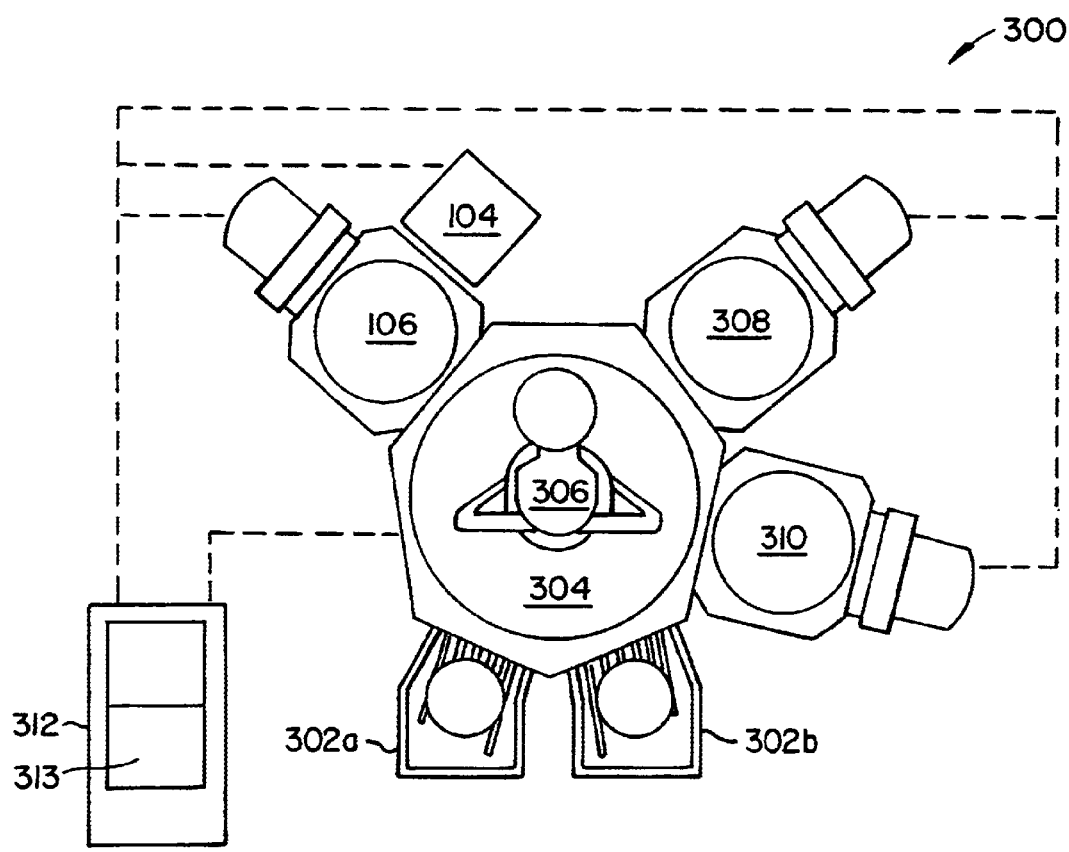
FIG. 3 is a top plan view of an automated tool for fabricating semiconductor devices in accordance with one embodiment of the present invention.

FIG. 3 is a top plan view of an automated tool 300 for fabricating semiconductor devices. The tool 300 comprises a pair of load locks 302a, 302b, and a wafer handler chamber 304 containing a wafer handler 306. The wafer handler chamber 304 and the wafer handler 306 are coupled to a plurality of processing chambers 308, 310. Wafer handler chamber 304 and the wafer handler 306 are coupled to the plasma chamber 106 of the processing system 100 of FIGS. 1A–C. The plasma chamber 106 has the inventive process monitoring system 104 coupled thereto (as shown). The entire tool 300 is controlled by a controller 312 (e.g., a dedicated controller for the tool 300, a remote computer system for running a fabrication process, a manufacturing execution system, etc.) having a program therein which controls semiconductor substrate transfer among the load locks 302a, 302b and the chambers 308, 310 and 106, and which controls processing therein.

The controller 312 contains a program for controlling the chamber 106 in real-time and for monitoring processing events (e.g., chucking, breakthrough, endpoint, etc.) in real-time via the inventive process monitoring system 104 as previously described with reference to FIGS. 1A–1F. The inventive process monitoring system 104 allows for better monitoring of the process of the plasma chamber 106 and more accurately identifies when processing events occur therein (effectively increasing the throughput of the plasma chamber 106). Accordingly, both the yield and the throughput of the automated fabrication tool 300 increases significantly.

The usefulness of monitoring a process utilizing a method in accordance with one embodiment of the present invention is now illustrated in connection with determining endpoint of a plasma chamber cleaning process.

Figure 4A:
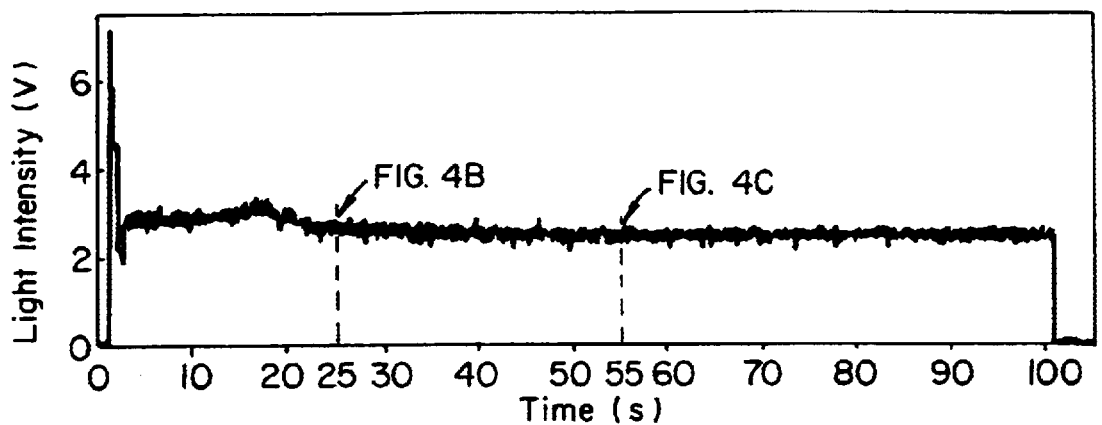
FIG. 4A plots intensity of a photodiode signal versus time for an in-situ plasma chamber cleaning process.

FIG. 4A plots optical emission intensity versus time for a plasma chamber cleaning process. Casual inspection of FIG. 4A indicates an initial, large change in signal intensity at a process time of about 2–3 sec., corresponding to creation of the plasma within the chamber. FIG. 4A then indicates some change in signal intensity through about 25 sec., with the period after 25 sec. showing little or no discernable change in the magnitude of the signal.

Figure 4B:
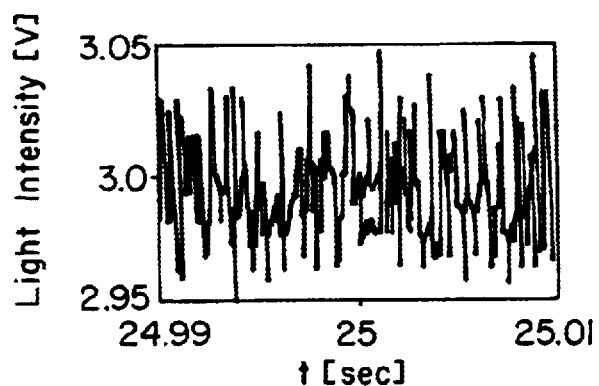
FIG. 4B is a blown-up view of FIG. 4A at 25±0.01 sec. into the cleaning process.
Figure 4C:
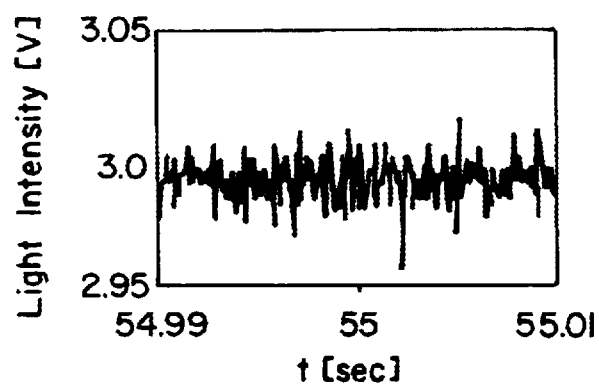
FIG. 4C is a blown-up view of FIG. 4A at 55±0.01 sec. into the cleaning process.

Closer inspection of FIG. 4A however, reveals the presence of additional information relating to the chamber cleaning process. FIG. 4B is an enlarged view of FIG. 4A at a process time of between 24.99 and 25.01 sec. The signal intensity of FIG. 4B shows significant deviation in signal intensity over this 0.02 sec. process interval. FIG. 4C is an enlarged view of FIG. 3A at a process time of between 54.99 and 55.01 sec. By contrast, the signal intensity of FIG. 4C exhibits significantly less deviation in signal intensity over this later 0.02 sec. process interval.

Comparison of FIGS. 4B and 4C indicates a difference in the character of optical emission, and hence progress of the cleaning process, between process times of 25 and 55 sec. However, this change is not evident from FIG. 4A, and moreover is not readily quantified for purposes of comparison by FIGS. 4B and 4C.

However, in accordance with one embodiment of the present invention it has been discovered that progress in a semiconductor fabrication process can be effectively monitored by measuring fluctuations in an output signal over a period of 10 milliseconds or less.

One measure of the amount of fluctuation in an output signal is standard deviation. Accordingly, an embodiment of method in accordance with the present invention monitors a plasma semiconductor fabrication process by determining change in standard deviation in intensity of optical emissions over a time period.

Standard deviation is generally defined by Equation (I) below:

$$\sigma = \sqrt{\sum_{i=1}^{n} \frac{(x_i - x_0)^2}{n-1}} \quad (I)$$

where:
sigma=standard deviation;
$x_i$=measured value;
$x_0$=mean of measured value; and
n=number of measured values.

Figure 5:
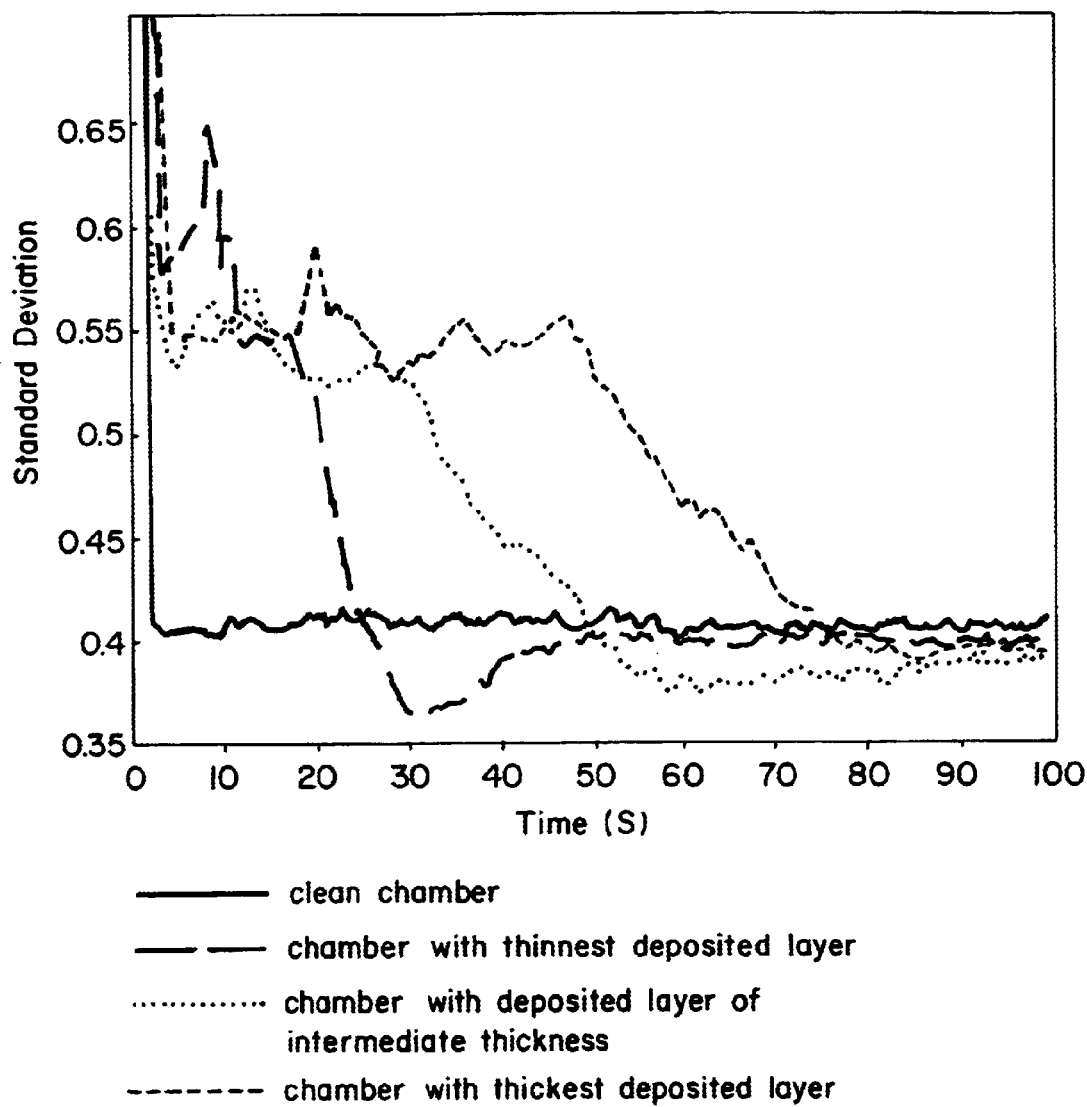
FIG. 5 plots standard deviation of intensity of a photodiode signal versus time for a chamber cleaning process performed on a clean chamber, a second chamber bearing a thin deposited layer, a third chamber bearing a deposited layer of intermediate thickness, and a fourth chamber bearing a deposited layer of the greatest thickness.

FIG. 5 plots standard deviation of intensity of a photodiode signal versus time of a plasma chamber cleaning process performed on a plasma chamber under several different conditions. Under a first set of conditions, the chamber is free from deposited materials. Under a second set of conditions, the chamber bears from a prior deposition process a deposited layer having a least thickness. Under a third set of conditions, the chamber bears from a prior deposition process a deposited layer having an intermediate thickness. Under a fourth set of conditions, the chamber bears from a prior deposition process a deposited layer having a greatest thickness. In plotting the data of FIG. 5, intensity of optical emissions was sampled at a rate of 10 kHz, with local standard deviation calculated once every second.

FIG. 5 shows-little or no change in standard deviation of the detected optical emission signal during exposure of the clean chamber to plasma. This indicates that little or no residual material was present in the chamber to react with and be consumed by the cleaning plasma.

Under the second set of deposition conditions resulting in formation of the thinnest layer within the plasma chamber, FIG. 5 shows large changes in standard deviation in intensity of the detected signal until about 50 sec. into the cleaning process. After about 50 sec., the standard deviation of intensity remains relatively constant.

Under the third set of deposition conditions resulting in formation of a layer of intermediate thickness within the plasma chamber, FIG. 5 shows significant variation in standard deviation in intensity until about 60 sec. into the process. After about 60 sec., the standard deviation of intensity remains relatively constant. Stabilization in standard deviation at a later time for the chamber bearing the deposited layer is consistent with the greater thickness of the deposited layer. Hence, removal of the seasoning layer requires exposure to plasma for a longer period of time.

Under the fourth set of deposition conditions resulting in formation of a layer of greatest thickness within the plasma chamber, FIG. 5 shows large variation in standard deviation in intensity of the detected signal until about 75 sec. into the cleaning process. After about 75 sec., the standard deviation of intensity remains constant. The fact that stabilization in standard deviation occurs later for the chamber bearing the deposited layer of greatest thickness is consistent with requiring exposure to plasma for the longest period of time in order for the deposited layer to be removed.

For each of the processes plotted in FIG. 5, stabilization of fluctuation in intensity of optical emissions, as reflected by standard deviation, indicates the endpoint of the cleaning process. The precision of this determination of plasma chamber clean endpoint is not available through conventional techniques such as resolving emissions into a spectrum over the processing period, monitoring changes in pressure of the plasma chamber, or monitoring changes in RF power.

Monitoring a semiconductor fabrication process in the manner just described offers a number of distinct advantages over conventional approaches. One advantage is enhanced flexibility.

Figure 2:
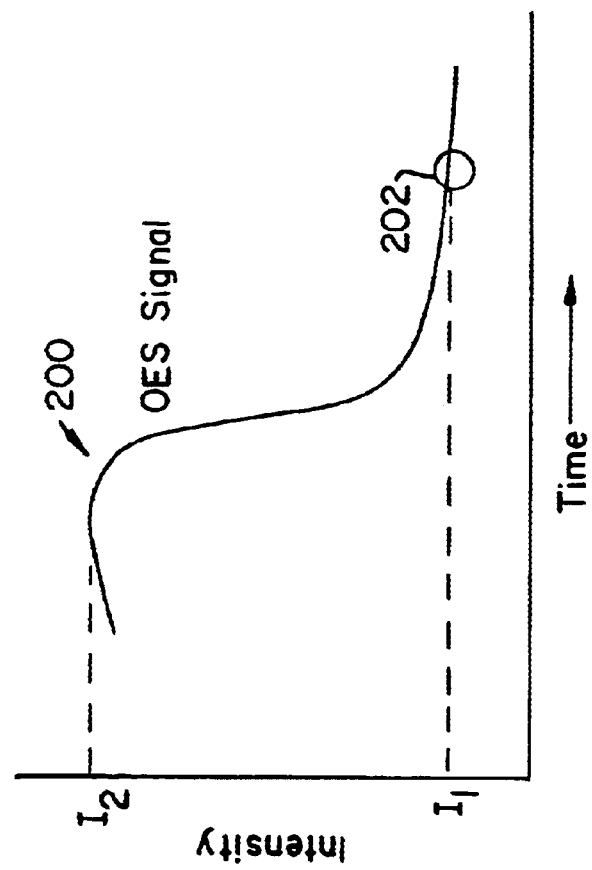
FIG. 2 is a representative graph of an optical emission intensity signal generated in FIG. 1A.

As shown in FIG. 2, conventional methods may monitor intensity of optical emissions only at particular wavelengths, with emission at these wavelengths characteristic of a processing event such as endpoint. However, the wavelengths monitored are generally specific to the composition of the material being processed (i.e. exposure of oxide residues to plasma may require monitoring a wavelength different from that monitored for exposure of polymer residues to plasma). Moreover, the wavelengths conventionally monitored are generally specific to the particular reactant material (i.e. removing a material with an oxygen-based plasma may require monitoring of a wavelength different than removal of the same material with a fluorine- based plasma).

However, methods in accordance with embodiments of the present invention monitor intensity of emissions over a broad spectral range. Therefore, the present invention is widely applicable to detect endpoint of plasma processing of any number of material compositions utilizing any number of reactant species. In this manner, the present invention exhibits enhanced flexibility over conventional techniques.

Another advantage of the present method is simplicity and economy. Where conventional techniques monitoring only specific emission wavelengths typically require a separate filter/detector configuration for each specific material being processed, the present invention utilizes simple emission detectors already present in the system, in conjunction with statistical analysis of the detected information. The present method therefore does not require that additional complex, expensive, and fault-susceptible apparatuses (for example optical filters) be deployed and then reconfigured to account for routine changes in the process being monitored.

A third advantage of the method in accordance with the present invention is enhanced reliability. For example, by relying only upon information presented by selected wavelengths, conventional methods determine endpoint based upon limited information that may be inaccurate. For example, in the case of the plasma chamber cleaning, prior processing steps may have resulted in formation of a residue on a chamber window that distorts only certain wavelengths of optical emissions transmitted through the window. Consideration of only the intensity of emission at these wavelengths would not provide an accurate picture of conditions within the plasma chamber.

By contrast, the method in accordance with one embodiment of the present invention utilizes optical intensity measurements taken across a broad region of the spectrum. The method is thus less susceptible to incomplete or incorrect information concerning the value of emission intensity at any particular wavelength.

Having fully described at least one embodiment of the present invention, other equivalent or alternative methods for controlling a semiconductor fabrication process according to the present invention will be apparent to those skilled in the art.

For example, while the embodiment of the present invention described above utilizes standard deviation to characterize fluctuation in a process output signal, this is not required by the present invention. Other techniques for quantifying fluctuation over time could also be utilized to monitor a semiconductor fabrication process. Such alternative techniques include, but are not limited to, calculation of mean deviation in the output, Fast Fourier Transform (FFT) of the output, calculation of the root-mean-square (RMS) value of the output, and calculation of entropy of the output signal.

Accordingly, FIGS. 6A–6D show an alternative embodiment of a method of monitoring a semiconductor fabrication process, wherein fluctuation in output is characterized by performing FFT on the optical emissions of a plasma chamber. In FIG. 6A, a photodiode signal representing total emission intensity from a plasma chamber is resolved into a contour plot of frequency and amplitude components over a local time period of 1 second utilizing FFT. FIG. 6A illustrates that emission of spectral data containing useful information occurs over a frequency range of between about 10–60 kHz.

FIGS. 6B and 6C plot amplitude of the photodiode signal over the 10–60 kHz frequency range at process times of 25 sec. and 37 sec., respectively. FIGS. 6B and 6C show that total power of optical emissions, as quantified by the areas under the respective amplitude vs. frequency curves, is greater at 25 sec. than at 37 sec. This indicates fluctuations in total power of optical emissions over time.

FIG. 6D is a power spectrum plotting total power of the photodiode signal over the 10–60 kHz frequency range versus processing time. The values for total power plotted in FIG. 6D are derived from the area under an amplitude vs. frequency plot for each time point. FIG. 6D shows that by about 42 sec., the total power has attained a steady state. This indicates endpoint of the cleaning process.

Figure 7:
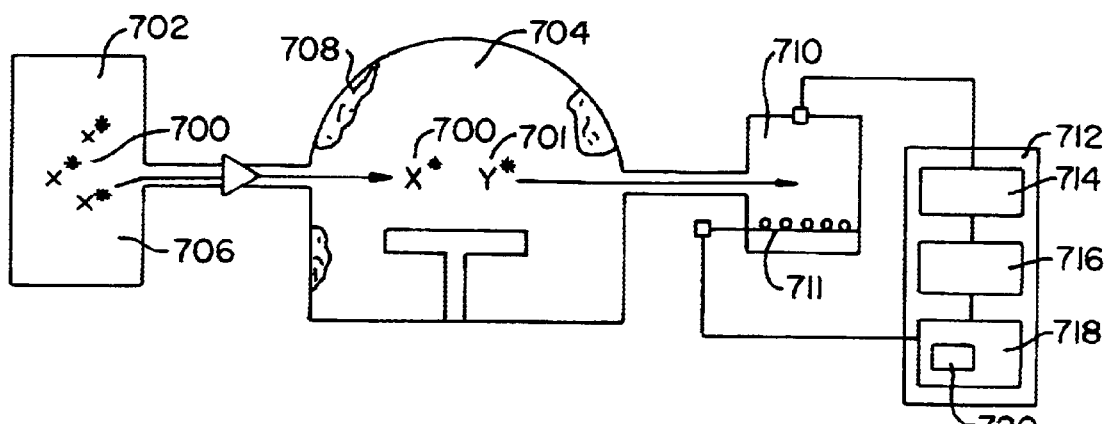
FIG. 7 shows a remote plasma monitoring cell receiving exhaust from a plasma chamber.

Cleaning a plasma chamber may not necessarily produce detectable optical emissions within the chamber itself, thereby preventing in-situ monitoring of endpoint. Accordingly, FIG. 7 shows a schematic view of an in-line remote chamber cleaning embodiment, wherein radical species 700 are generated in remote plasma source 702, and then injected into plasma chamber 704. The injected radical species react with and consume residual materials 708 on exposed surfaces of chamber 704. Due to an absence of electrons in the chamber however, little or no optical emission takes place in chamber 704 itself during this process.

Nevertheless, a method in accordance with an alternative embodiment of the present invention may be employed to detect endpoint of this cleaning process. Specifically, radical species 701 may be extracted from cleaned chamber 704 and flowed downstream through exhaust line 705 to plasma cell 710 remote from chamber 704. Radical species 701 may include unreacted radical species 700 originally generated, and may also include radical species produced by reaction within the plasma chamber.

Radical species 701 flowed into remote plasma cell 710 are exposed to RF energy from electrode 711 in the presence of electrons, such that optical emissions occur and can be sensed by detection apparatus 712 comprising photodiode 714, pre-amplifier 716, and processor 718 having memory 720 containing instructions in the form of a computer program.

Figure 8:
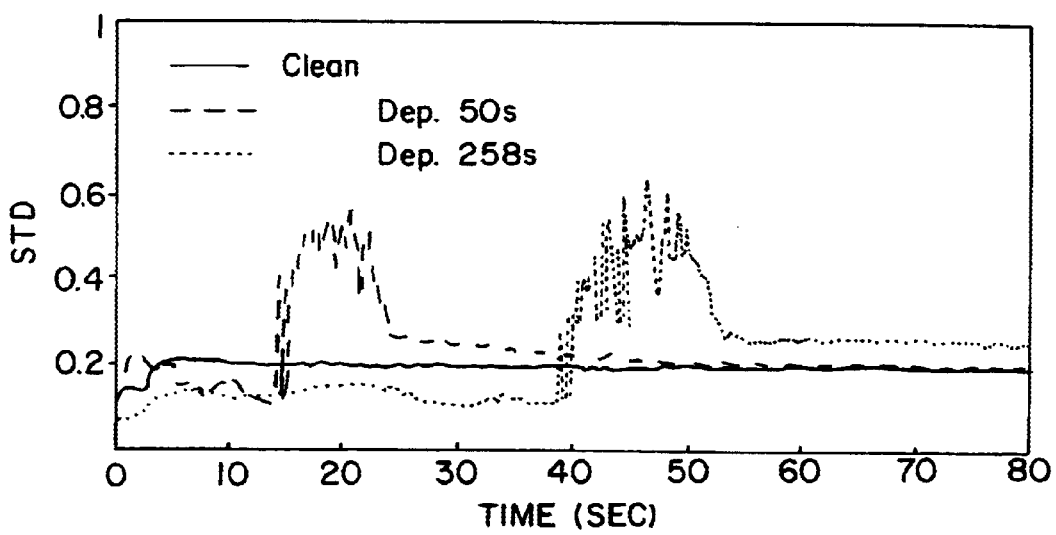
FIG. 8 plots standard deviation in detected optical emission versus time for plasma generated at the exhaust line of the apparatus of FIG. 7.

FIG. 8 plots standard deviation in detected optical emissions versus time for the apparatus described above in connection with FIG. 7, for a cleaning process performed on a plasma chamber under several different conditions. Under a first set of conditions, the plasma chamber is free of deposited materials. Under a second set of conditions, the plasma chamber bears a layer deposited for 50 sec. Under a third set of conditions, the plasma chamber bears a layer deposited for 258 sec. Consistent with the results of FIG. 5, FIG. 8 indicates that the time at which fluctuation in standard deviation reaches a minimum level is significantly longer for the chamber bearing the layer deposited for the longest time (and hence having the greatest thickness).

While the present invention has been described primarily in conjunction with detecting variation in fluctuation of a detected optical emission signal, the present invention is not limited to detecting this type of signal. Other attributes of a plasma process, such as chamber pressure, chamber temperature, or RF power delivered to a plasma chamber, also contain information useful in monitoring progress of the process.

Figure 9:
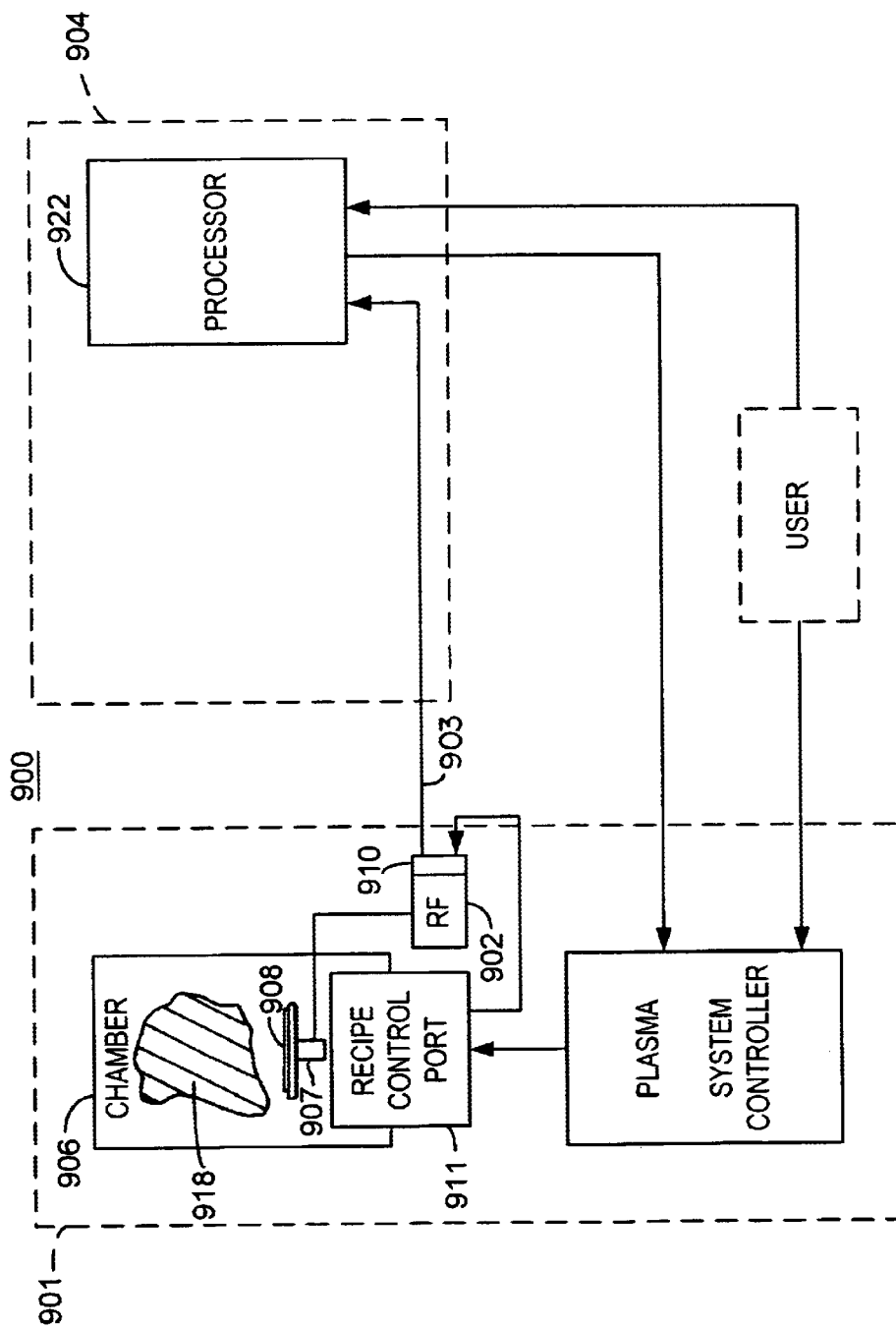
FIG. 9 is a schematic diagram of the plasma processing system of FIGS. 1A–C adapted to monitor plasma processing by detecting fluctuation in RF power.

Accordingly, FIG. 9 is a schematic diagram of processing system 900 comprising a plasma system 901 wherein the inventive process monitoring system 904 is adapted to monitor fluctuations in RF power delivered to a wafer pedestal of a plasma chamber. Specifically, within the inventive process monitoring system 904, signals representative of RF power delivered to the plasma chamber 906 are supplied to the processor 922. The RF power signals are supplied from an RF wafer bias generator 902 of the plasma system 901 via a fifth control bus 903. It will be understood that an optical detector may be employed to supply OE signals to the processor 922 along with the RF power signals if desired.

As shown in FIG. 9, the RF wafer bias generator 902 is coupled to the recipe control port 911 (e.g., for receiving the RF power level required for the desired plasma recipe) and to a wafer pedestal 907 located within the plasma chamber 906. The wafer pedestal 907 is shown having a semiconductor wafer 908 disposed thereon. As is known in the art, when an inductively coupled plasma source is employed to generate the plasma 918, typically an RF generator (not shown) drives an RF antenna (not shown) disposed outside the plasma chamber 906, and if a wafer bias is desired, a separate RF wafer bias generator (e.g., the RF wafer bias generator 902) provides the wafer bias. However, when a capacitively coupled plasma source is employed, a second electrode (not shown) is disposed within the plasma chamber 906, and a single RF generator (e.g., the RF wafer bias generator 902) delivers power to both the wafer pedestal 907 and the second electrode.

The RF wafer bias generator 902 comprises a data port such as an analog input/output interface 910 at the backside of the generator for controlling and monitoring the RF power delivered by the generator 902. For example, the interface 910 may provide linear, 0–10 volt, DC voltage outputs that are scaled to represent the power delivered to the wafer pedestal 907 from the RF generator 902 (i.e., the forward power) and the power reflected from the wafer pedestal 907 back to the RF generator 902 (i.e., the reflected power), or the forward and reflected power signals may be represented in any other analog or digital form with arbitrary scaling. These forward and reflected power signals are provided to the processor 922 as RF power "detection" signals via the fifth control bus 903 and monitored over time to provide information regarding the progress of the process.

While the embodiment described in FIG. 9 detects endpoint by monitoring fluctuation of RF power applied directly to the plasma chamber, the present invention is not limited to this configuration. Fluctuation in RF power occurring in a plasma cell positioned downstream from the plasma chamber, as described in conjunction with FIG. 7, could also be monitored to determine process endpoint.

Moreover, while the above discussion focuses upon use of the present method to monitor progress and endpoint of a plasma chamber cleaning process, the invention is not limited to this type of application. The method in accordance with the present invention could be also be employed to detect endpoints in other semiconductor fabrication processes. For example, an output of a metrology sensor could also be monitored to provide information concerning progress of a chemical mechanical polishing (CMP) process. The present invention is also applicable to monitor other fabrication techniques such as photolithography baking steps.

Given the above detailed description of the present invention and the variety of embodiments described therein, these equivalents and alternatives along with the understood obvious changes and modifications are intended to be included within the scope of the present invention.

What is claimed is:

1. A method for monitoring a semiconductor fabrication process comprising:
   measuring a value of an output from the semiconductor fabrication process;
   characterizing a fluctuation in the value of the output over a time period of 10 milliseconds or less; and
   correlating the fluctuation to an event of the semiconductor fabrication process.

2. The method of claim 1 wherein measuring a value of an output comprises detecting an analog value of the output.

3. The method of claim 2 wherein characterizing fluctuation in the output comprises determining a standard deviation of the output from a local average.

4. The method of claim 3 wherein determining a standard deviation comprises:
   passing the analog signal through a band pass filter to produce a filtered analog signal;
   multiplying the filtered analog signal by itself to produce a squared filtered analog signal; and
   passing the squared filtered analog signal through a low pass filter.

5. The method of claim 2 wherein characterizing a fluctuation comprises calculating a root-mean-square of the value.

6. The method of claim 1 wherein measuring a value of an output comprises:
   detecting an analog value of the output; and
   sampling the analog value of the detected process output at a sampling rate of 1 kHz or greater; and
   converting the sampled analog value to a digital value.

7. The method of claim 6 wherein characterizing a fluctuation comprises calculating a standard deviation of the sampled value over the second time period.

8. The method of claim 6 wherein characterizing a fluctuation comprises:
   performing a Fast Fourier Transformation (FFT) to resolve the sampled value into an amplitude of a frequency component; and
   plotting a fluctuation of the amplitude.

9. The method of claim 6 wherein characterizing a fluctuation in the value of the output comprises calculating a root-mean-square of the sampled value.

10. The method of claim 1 wherein correlating fluctuation in value of the output to a process event comprises correlating a steady state of the output value to a process endpoint.

11. The method of claim 1 wherein measuring a value of the output comprises measuring an intensity of light emitted from a plasma.

12. The method of claim 11 wherein the light intensity is measured in a chamber in which the plasma is generated.

13. The method of claim 11 wherein the light intensity is measured in a cell downstream from a chamber in which the plasma is generated.

14. The method of claim 11 wherein measuring an intensity of light comprises measuring a current output by a photodiode receiving the emitted light.

15. The method of claim 11 wherein measuring an intensity of light comprises measuring a current output by a monochrometer receiving the emitted light and coupled to a photomultiplier tube.

16. The method of claim 1 wherein measuring a value of the output comprises measuring an RF power supplied during generation of a plasma.

17. The method of claim 16 wherein the RF power is measured in a chamber in which the plasma is generated.

18. The method of claim 16 wherein the RF power is measured in a cell downstream from a chamber in which the plasma is generated.

19. The method of claim 1 wherein measuring a value of the output comprises measuring a temperature.

20. The method of claim 1 wherein measuring a value of the output comprises measuring a mass of a product material by mass spectrometry.

21. An apparatus for processing a substrate, said apparatus comprising:
   a substrate processing chamber;
   a sensor operatively coupled to said substrate processing chamber to detect a value of an output from the chamber;
   a computer processor operatively coupled to said sensor; and
   a memory coupled to said computer processor, said memory storing a computer program in computer readable format including computer instructions to permit said processor to;
measure a value of an output from the process, and characterize a fluctuation in the value of the output over a time period of 10 milliseconds or less.

22. The apparatus of claim 21 wherein:
the substrate processing chamber comprises a plasma chamber;
the sensor comprises a photodiode in optical communication with the plasma chamber through a window; and
the memory stores a computer program including computer instructions to permit said processor to measure an intensity of plasma emission.

23. The apparatus of claim 21 wherein:
the substrate processing chamber comprises a plasma chamber;
the sensor comprises a monochrometer in optical communication with the plasma chamber through a window and coupled to a photomultiplier tube; and
the memory stores a computer program including computer instructions to permit said processor to measure an intensity of plasma emission.

24. The apparatus of claim 21 wherein:
the substrate processing chamber comprises a plasma chamber;
the sensor is in electrical communication with an RF wafer bias generator; and
the memory stores a computer program including computer instructions to permit said processor to measure an RF power.

25. The apparatus of claim 21 wherein the memory stores a computer program including computer instructions enabling the processor to characterize a fluctuation by calculating a standard deviation of the value of the output.

26. The apparatus of claim 21 wherein the memory stores a computer program including computer instructions enabling the processor to characterize a fluctuation by performing a Fast Fourier Transformation of the value of the output.

27. The apparatus of claim 21 wherein the memory stores a computer program including computer instructions enabling the processor to characterize a fluctuation by calculating an entropy of the value of the output.

28. The apparatus of claim 21 wherein the processor comprises:
a band pass filter in electrical communication with the sensor and receiving an analog electrical signal from the sensor;
a multiplier in electrical communication with the band pass filter and receiving a filtered electrical signal from the band pass filter; and
a low pass filter in electrical communication with the multiplier and receiving a multiplied signal from the multiplier.

29. The apparatus of claim 21 wherein the processor comprises:
an analog to digital converter in electrical communication with the sensor and receiving an analog electrical signal from the sensor; and
a logic structure in electrical communication with the analog to digital converter and receiving a sampled digital signal from the analog to digital converter and performing a calculation on the sampled digital signal.

30. The apparatus of claim 29 wherein the logic structure is configured to calculate a standard deviation of the sampled digital signal.

31. The apparatus of claim 29 wherein the logic structure is configured to perform a Fast Fourier Transformation on the sampled digital signal.

32. The apparatus of claim 21 wherein:
the substrate processing chamber comprises a plasma chamber;
the sensor comprises a photodiode in optical communication with a plasma cell remote from the plasma chamber and receiving exhaust from the plasma chamber; and
the memory stores a computer program including computer instructions to permit said processor to measure an intensity of plasma emission.

33. The apparatus of claim 21 wherein:
the substrate processing chamber comprises a plasma chamber;
the sensor comprises a monochrometer in optical communication with a plasma cell remote from the plasma chamber and coupled to a photomultiplier tube, the plasma cell receiving exhaust from the plasma chamber; and
the memory stores a computer program including computer instructions to permit said processor to measure an intensity of plasma emission.

34. The apparatus of claim 21 wherein:
the substrate processing chamber comprises a plasma chamber;
the sensor is in electrical communication with an RF wafer bias generator positioned in the plasma chamber; and
the memory stores a computer program including computer instructions to permit said processor to measure an RF power.

35. The apparatus of claim 21 wherein:
the substrate processing chamber comprises a plasma chamber;
the sensor is in electrical communication with an RF wafer bias generator positioned in a plasma cell remote from the plasma chamber and receiving the exhaust of the plasma chamber; and
the memory stores a computer program including computer instructions to permit said processor to measure an RF power.

* * * * *